United States Patent
Moussavi et al.

[11] Patent Number: 5,952,826
[45] Date of Patent: Sep. 14, 1999

[54] RADICAL SOLUTION FOR NUCLEAR MAGNETIC RESONANCE MAGNETOMETER

[75] Inventors: Mehdi Moussavi, Corenc; Karine Lang, Grenoble, both of France

[73] Assignee: Commissariat A l'Energie Atomique, Paris, France

[21] Appl. No.: 08/763,506

[22] Filed: Dec. 11, 1996

[30] Foreign Application Priority Data

Dec. 19, 1995 [FR] France .................................. 95 15050

[51] Int. Cl.$^6$ .............................. G01V 3/00; G01N 24/00
[52] U.S. Cl. ............................................. 324/301; 436/173
[58] Field of Search .................................. 324/300, 301, 324/302, 303; 436/173

[56] References Cited

U.S. PATENT DOCUMENTS

| | | | |
|---|---|---|---|
| 3,966,409 | 6/1976 | Hrvoic et al. .......................... | 23/230 R |
| 5,198,767 | 3/1993 | Glenat et al. ............................ | 324/301 |
| 5,681,753 | 10/1997 | Bourbon et al. ......................... | 436/173 |

FOREIGN PATENT DOCUMENTS

| | | |
|---|---|---|
| 0 423 033 | 4/1991 | European Pat. Off. . |
| WO 93/02710 | 2/1993 | WIPO . |

OTHER PUBLICATIONS

Journal of the Chemical Society, Perkin Transactions 2, pp. 2049–2052, 1993, R. Bolton, et al., "An EPR and NMR Study of Some Tetramethylisoindolin–2–yloxyl Free Radicals".

*Primary Examiner*—Louis Arana
*Attorney, Agent, or Firm*—Oblon, Spivak, McClelland, Maier & Neustadt, P.C.

[57] ABSTRACT

This invention relates to a radical solution for nuclear magnetic resonance magnetometry, having resistance to magnetic field gradients over a wide temperature range. This solution consists of a nitroxide radical with the formula:

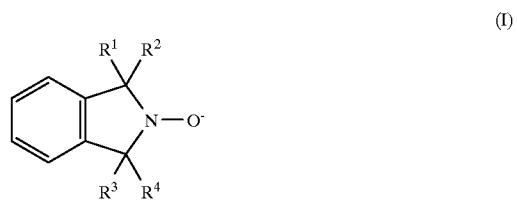

(I)

in which $R^1$, $R^2$, $R^3$ and $R^4$, which may be identical or different, represent an alkyl group or an alkoxy group which may be deuterated, or in which the $R^1$–$R^2$ and/or $R^3$–$R^4$ couples together form a cycloalklyl or polycycloalkyl group which may be deuterated, and N represents $^{14}$N or $^{15}$N, dissolved in a solvent consisting of a dimethyl ether with the formula:

$$CH_3O(CH_2CH_2O)n\ CH_3 \qquad (II)$$

in which n equals 3 or 4.

15 Claims, 8 Drawing Sheets

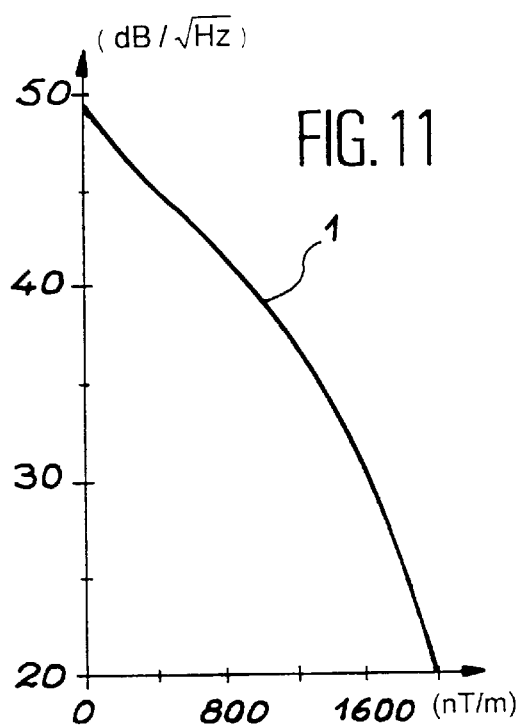
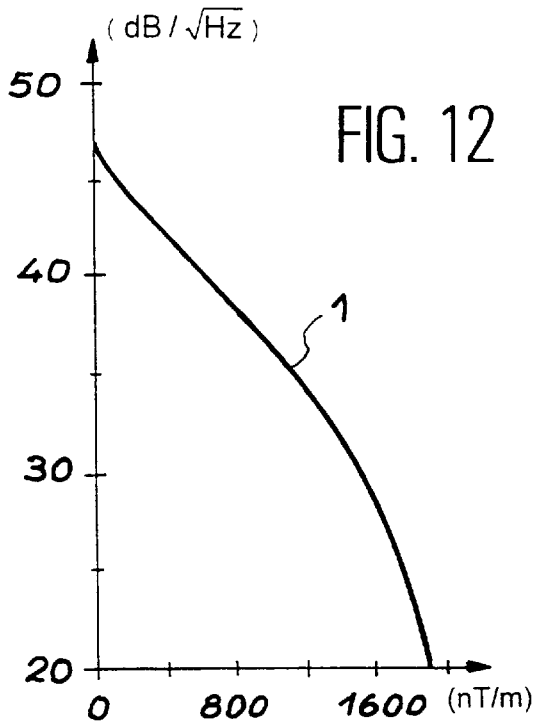
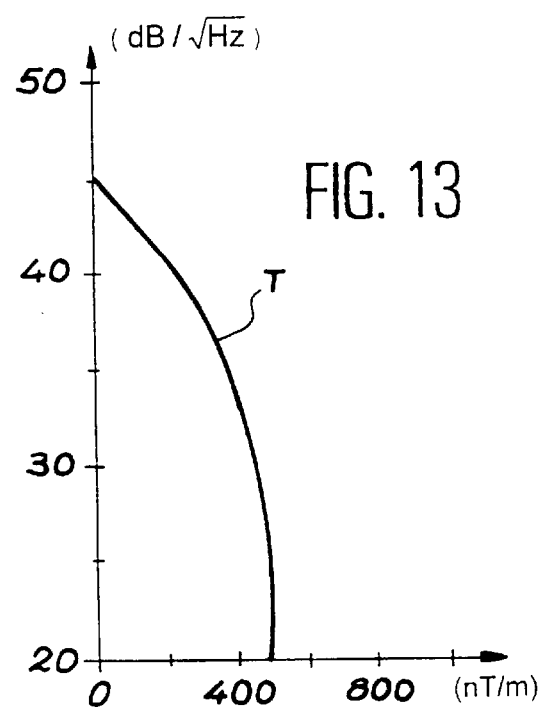
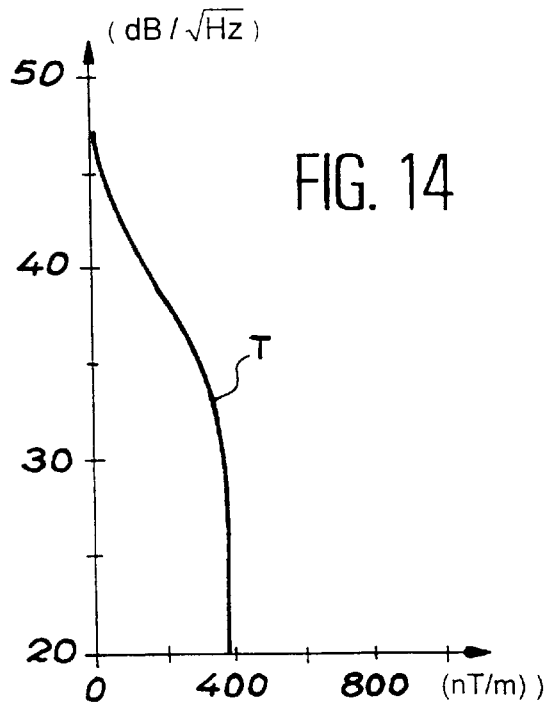

RADICAL SOLUTION FOR NUCLEAR MAGNETIC RESONANCE MAGNETOMETER

DESCRIPTION

The present invention relates to a radical solution for nuclear magnetic resonance magnetometers with dynamic polarization.

More precisely it relates to a new radical solution whose nuclear magnetic resonance (NMR) signal in a weak field can be used over a wide temperature range, is stable at high temperatures and has little response to magnetic field gradients.

It applies in particular to NMR magnetometry with dynamic polarization under extreme temperature and magnetic environment conditions characteristic of drilling wells.

The performance of NMR magnetometers is strongly related to the radical solution which is a component part of a magnetometer, and therefore to the behavior of this solution over the range of temperatures and magnetic field gradients applied to the magnetometer.

The thesis published by R. Besson (Université Joseph Fourier de Grenoble, 1973, pages 47 to 49 and 65 to 67) mentions several radical solutions which can be used in magnetometry. Since the use of the first radical (Fremy salt) the technique has developed towards other more stable nitroxide radicals of N–O˙ type which allow amplification of the NMR signal of the solvent through stronger dynamic polarization. Nitroxide radicals of this type are described in particular in documents FR-A-2 653 121 and EP-A-O 183 825.

The radical solution currently used in magnetometers for drilling wells is the so-called Thetis solution which consists of the nitroxide radical Tanane (2,2,6,6-tetramethylpiperidine-1-oxyl) at a concentration of $10^{-3}$ mol/l in a solvent consisting of a mixture of water and 5% diglyme (dimethyl ether of glycol diethylene).

This radical solution allows the magnetometer to function over a range of temperatures between 10° C. and 125° C. under a very low magnetic field gradient. With this solution the NMR signal deteriorates considerably in the presence of higher gradients and the operating range of the magnetometer is consequently limited to a gradient of a few hundred nT. Also, the acceptable maximum value decreases when temperature rises; this limit value is 700 nT at 40° C. and decreases to 500 and subsequently to 200 nT at the respective temperatures of 70 and 100° C.

The operating range of the magnetometer is therefore not sufficient for its successful use in wells of considerable depth characterized by a surrounding temperature which may reach over 125° C. and by the presence of magnetic silt which generates field gradients which may exceed 1000 nT/m.

Moreover, radical solutions subjected to high temperatures are not stable due to a vanishing process of the radical –NO˙ connected with the formation of hydroxylamine through reaction with the protons of the hydrogenated solvent at high temperature, according to the following reaction process:

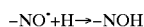

which leads to transformation of the nitroxide radical into hydroxylamine.

It would therefore be of interest to have radical solutions available which are suitable for the magnetometer to function at temperatures exceeding 125° C. with field gradients which may exceed 1000 nT/m.

It is known that the performance of a radical solution is related to the dynamic polarizing factor DPF which may be defined by the following equation:

$$FPD = \frac{2 \cdot f \cdot A}{g \cdot \omega_1} \phi(\Delta H_{RPE})$$

in which:

A is the hyperfine interaction constant of the radical g is the number of energy levels of the radical, $\omega_1$ is the Larmor frequency of the proton f is the efficiency factor of the coupling between the protons of the solvent and the free electron of the radical, $\phi$ is a decreasing function of line width RPE in a high field of the solution, $\Delta H_{RPE}$, and of the number of lines of the spectrum of electronic paramagnetic resonance.

With the Thetis solution (Tanane solution at a concentration of $10^{-3}$ mol/l in the water +5% diglyme mixture) $\Delta H_{RPE}$ is 32 $\mu$T at 20° C.

This behavior of the radical solution is also dependent upon:

NMR relaxation time, $T_2$, and the stability of the radical solvent couple for applications at high temperatures.

With a relaxation time of $T_2$, the shorter this period the more negligible becomes the effect produced by a magnetic field gradient on the solution. Therefore, with the Thetis solution, $T_2$ is 1.1 s at 20° C. and $T_2$ increases approximately exponentially with temperature to reach 5.37 s at 120° C.

Therefore, in order to obtain a radical solution with a good NMR signal, first a stable radical-solvent couple must be found which has efficient coupling, that is to say with an efficiency factor (f) nearest to 1, with fine line width RPE and with a relaxation time $T_2$ of less than 1.1 s at 20° C. so that the radical solution is more resistant to magnetic field gradients than the Thetis solution currently used.

The present invention relates precisely to a radical solution having these properties so that it may be used for nuclear magnetic resonance magnetometry with dynamic polarization over a temperature range of 0° C. to 150° C. with magnetic field gradients which may exceed 1000 nT/m.

According to the invention, the radical solution contains a nitroxide radical and it is characterized in that it consists of a nitroxide radical whose formula is:

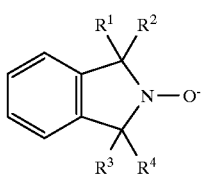

(I)

in which $R^1$, $R^2$, $R^3$ and $R^4$ which may be identical or different, represent an alkyl group or possibly a deuterated alkoxy group, or in which the couples $R^1$–$R^2$ and/or $R^3$–$R^4$ together form a cycloalkyl or a polycycloalkyl group which may be deuterated, and N represents $^{14}$N or $^{15}$N;

dissolved in a solvent consisted of a dimethyl ether with the formula:

(II)

in which n equals 3 or 4.

In formula I given above for the nitroxide radical, groups $R^1$, $R^2$, $R^3$ and $R^4$ may be alkyl or alkoxy groups or may together form cycloalkyl groups. The alkyl or alkoxy groups which may be used may be linear or ramified groups generally having 1 to 5 carbon atoms of which all or some of the hydrogen atoms may be replaced by atoms of deuterium D.

When $R^1$–$R^2$ and/or $R^3$–$R^4$ together form a cycloalkyl group, the latter preferably has 4 to 11 carbon atoms. $R^1$, $R^2$, $R^3$ and $R^4$ are preferably lower alkyl groups of 1 to 4 carbon atoms, in particular methyl groups.

In this nitroxide radical, the nitrogen atom may be $^{14}N$ or $^{15}N$. Preferably $^{15}N$ is used. Also, alkyl or deuterated alkoxy groups are preferably used for $R^1$, $R^2$, $R^3$ and $R^4$.

As an example of appropriate nitroxide radical, mention can be made of those which meet the formulae:

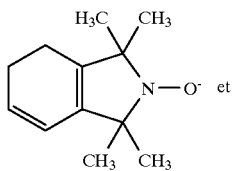

(III)

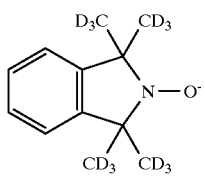

(IV)

According to the invention, the use of a nitroxide radical meeting the formulae (III and IV) given above can achieve improved stability of the solution in comparison with that achieved with the Tanane type radical.

By adding a 6 carbon atom cycle consisted of a benzene cycle to the nitroxide radical of 2,2,5,5,-tetramethyl-pyrrolidine-1-oxyl type, the volume of the molecule can be increased and it can be made rigid to form a flat molecule and to increase its stability. Therefore, in solution in water at a concentration of $10^{-3}$ mol/l, the nitroxide radical with the formula:

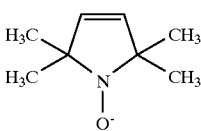

(5)

has a half-life period of 250 hours at 150° C. in water, whereas the nitroxide radical of formula (III) used in the invention shows at this same temperature a half-life period which is substantially longer than 250 hours since the signal loss in the same solvent is only 10% after 300 hours.

It is specified that the half-life period of a nitroxide radical corresponds to the time elapsed between the time when the radical is brought to the required temperature and the time when the RPR signal of this radical has lost 50% of its initial value.

The nitroxide radical meeting the formula (III) given above is described in particular by R. Bolton et al. In J/Chem. Soc. Perkin Trans. 2, 1993, pages 2049–2052.

In the radical solution of the invention, the solvent used, which consists of a dimethyl ether of formula (II), has a high degree of purity which may be obtained by bi-distillation. It is important to remove certain impurities which may be found in the solvent which might lead to degradation of the radical. In particular, the bi-distillation stage can remove 2,6 di-tert-butyl-4-methylphenol which is used as stabiliser in marketed formula (II) products in order to prevent the formation of peroxides. With the removal of this stabilizer (antioxidant) the degradation of the radical through hydroxylamine formation can be prevented.

For the radical solution of the invention, dimethyl ether of formula (II) is chosen in order to obtain the efficiency factor (f) that is nearest to 1 without however causing too great an increase in line width RPE. Preferably a dimethyl ether of formula (II) is used in which n is 3 or 4, the best results being obtained when n equals 3.

The nitroxide radical concentration of the solution is chosen in such manner as to obtain a good NMR signal while nevertheless obtaining a good dynamic polarizing factor DPF.

Generally, good results are obtained with concentrations in the range of $10^{-3}$ to $10^{-2}$ mol/l.

The nitroxide radicals of formula (I) used in the invention may be prepared using conventional methods. In particular the synthesis method described in Aust. J. Chem. 1983, 36, p. 397–401 may be used.

The invention also relates to a probe for a nuclear magnetic resonance magnetometer, comprising two units each comprising a coil surrounding a container filled with a sample consisting of a solution containing a nitroxide radical, and two resonating cavities to excite the two samples at two separate frequencies, characterized in that each sample is a solution of a nitroxide radical according to the invention.

Other characteristics and advantages of the invention will be better understood on reading the following description, which is evidently given for illustrative purposes and is non-restrictive, with reference to the appended drawings.

(FIG. 8), of 50° C. (FIG. 9) and 100° C. (FIG. 10).

FIGS. 11 to 14 are diagrams representing the progression of the signal to noise ratio (in dB/√√Hz) exiting the nuclear oscillators using solution 1 of the invention at 40° C. (FIG. 11) and 70° C. (FIG. 12) or solution T at 40° C. (FIG. 13) and 70° C. (FIG. 14) in relation to the outer magnetic field gradient applied (en nT/m).

Figure 15:
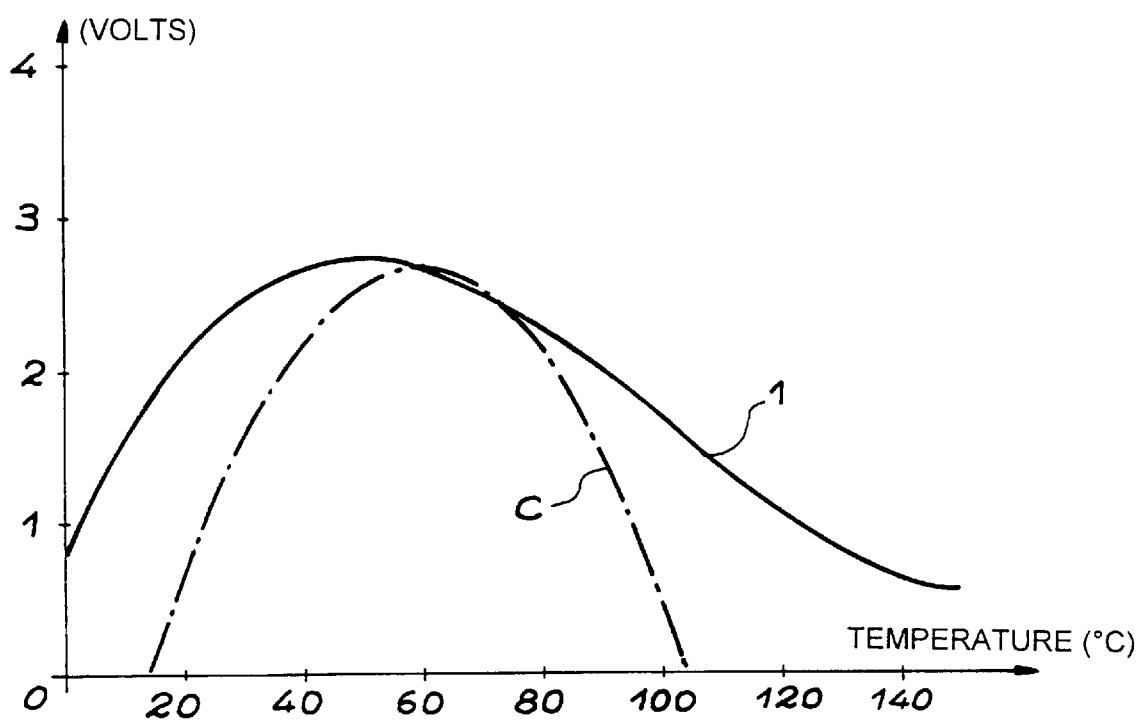

FIG. 15 is a diagram representing the variations in the NMR nuclear signal (en V) exiting the probe in relation to temperature (in ° C.) for solution 1 of the invention and for solution C given for comparison.

Figure 16:
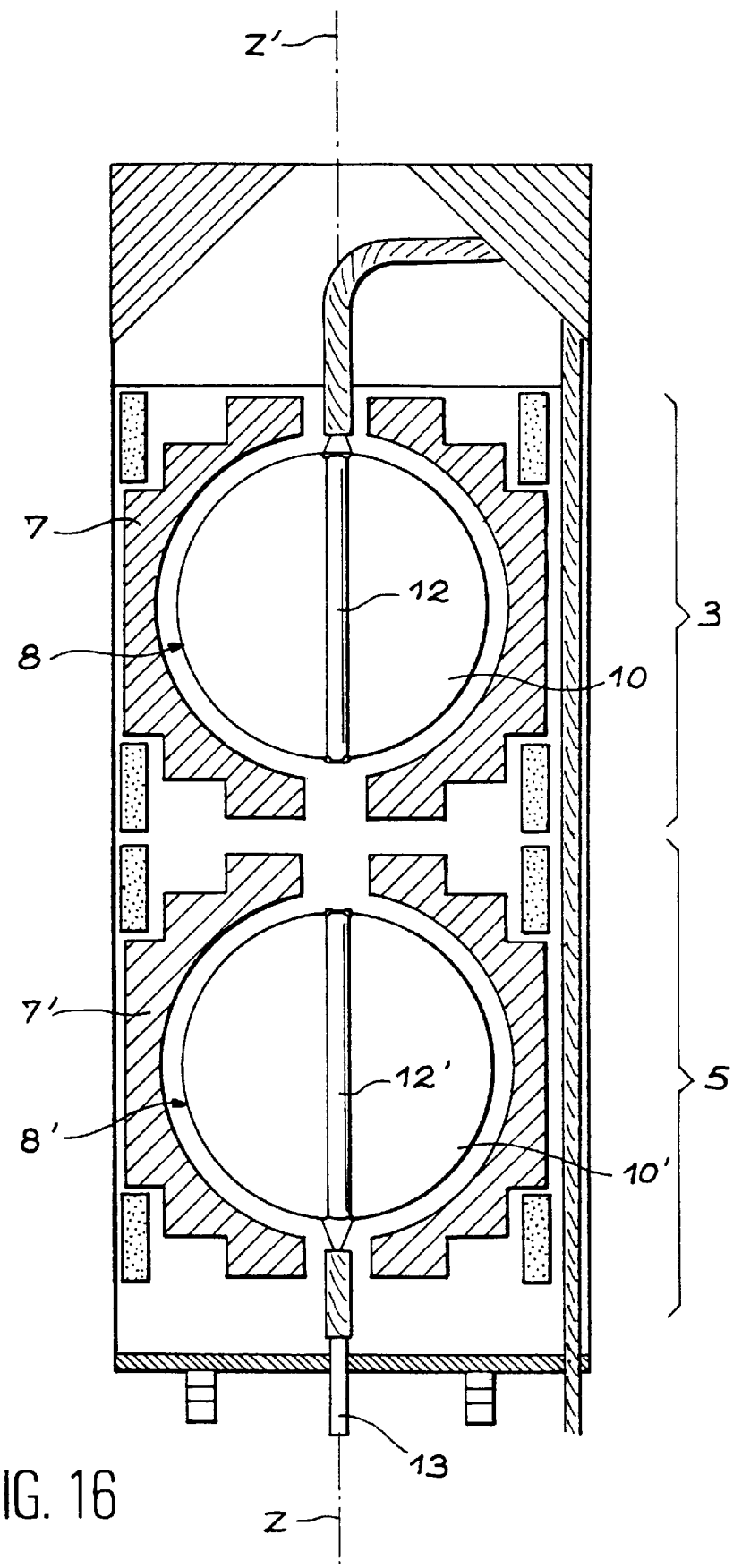

FIG. 16 is a drawing of a nuclear magnetic resonance probe of the invention.

In the following description two radical solutions according to the invention are used comprising the nitroxide radical (Tmio 15D) of formula (I) in which $R^1$, $R^2$, $R^3$ and $R^4$ are the deuterated methyl group and N represents $^{15}N$ in triglyme, that is to say dimethyl ether of formula (II) with n equalling 3. The triglyme used is the marketed product which we submit to bi-distillation to remove impurities, in particular the stabilizer that is present in the marketed product.

Radical solution 1 comprises $2.10^{-3}$ mol/l of Tmio 15D and solution 2 comprises $10^{-3}$ mol/l of Tmio 15D.

For comparative purposes, solution T of the prior art is also used, consisting of the nitroxide radical Tanane at a concentration of $10^{-3}$ mol/l in the water +5% diglyme mixture (Thetis solution) and solution C consisting of Tmio 15D at a concentration of $10^{-3}$ mol/l in the water/5% diglyme mixture.

A further solution 3 according to the invention comprises Tmio 15D at a concentration of $10^{-3}$ mol/l in tetraglyme, that is to say dimethyl ether of formula (II) where n is 4.

Table I below groups together the properties at 20° C. and 120° C. of solutions 1, 2 and 3 of the invention and of the solution of the prior art (Thetis solution).

TABLE I

| | | $\Delta H_{RPE}$ | F | $T_2$ (s) |
|---|---|---|---|---|
| Solution 1 | | | | |
| $2.10^{-3}$M | 20° C. | 34 µT | 0.77 | 0.48 |
| | 120° C. | 69 µT | 0.7 | 2.5 |
| Solution 2 | | | | |
| $10^{-3}$M | 20° C. | 27 µT | 0.45 | 0.34 |
| | 120° C. | 47.9 µT | 0.53 | 3.27 |
| Solution 3 | | | | |
| $10^{-3}$M | 20° C. | 30 µT | 0.40 | 0.39 |
| | 120° C. | 40 µT | 0.57 | 2.71 |
| Solution T | | | | |
| $10^{-3}$M | 20° C. | 32 µT | 0.66 | 1.1 |
| | 120° C. | 71.9 µT | 0.54 | 5.37 |

On reading this table it will be noticed that line widths are finer with the solutions of the invention, and the efficiency factor is higher and the relaxation time shorter with solution 1.

Therefore better properties are obtained with the radical solutions of the invention. Also, it will be noted that by doubling the nitroxide radical concentration (solution I) the NMR signal is greatly increased through the efficiency factor (0.77) without however causing too great an increase in line width RPE. On the other hand, with solution T of the prior art, if the Tanane concentration is doubled the increase in line width RPE is too great.

As resistance to field gradients is related to a very short relaxation time $T_2$, the solutions of the invention resist field gradients that are two or three times higher than the gradients that can be tolerated by the solution of the prior art as their relaxation times are distinctly shorter.

The properties of solutions 1 and 2 of the invention are described in more detail with reference to FIGS. 1 to 15. In these figures the results obtained with the solution T (Thetis solution) of the prior art have been given for comparison.

Figure 1:
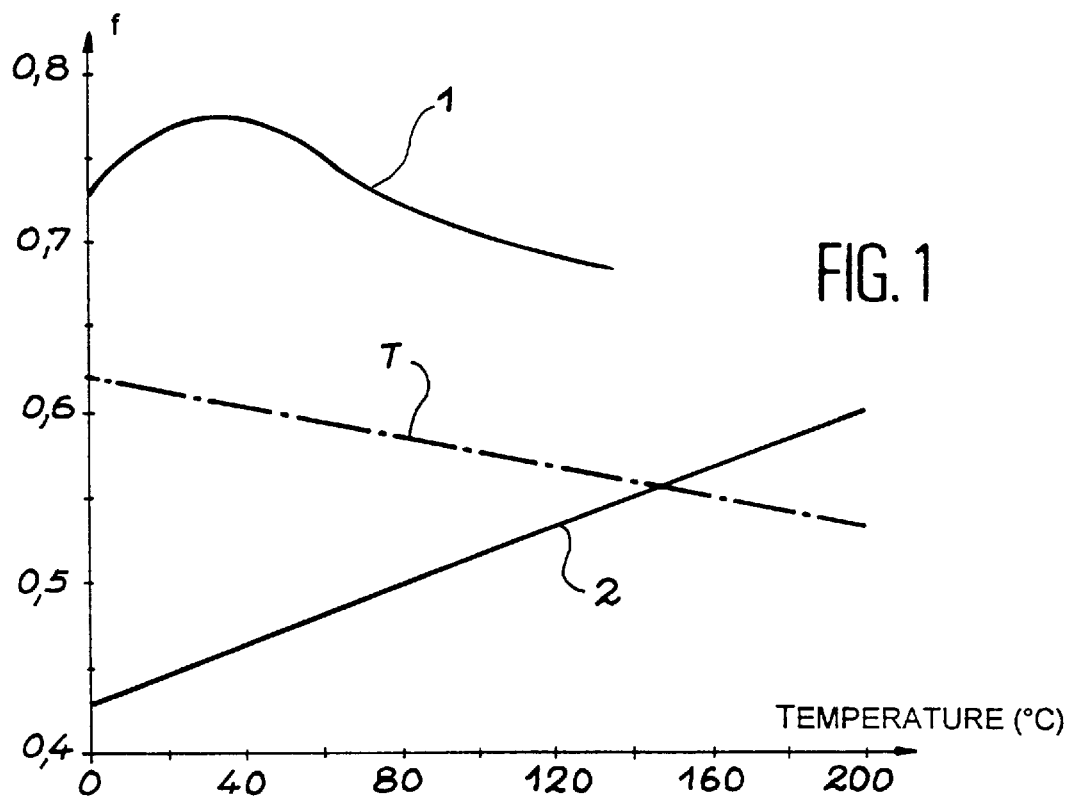
FIG. 1 is a diagram representing the progression of efficiency factor (f) in relation to the temperature (in ° C.) of a radical solution of the prior art (reference T)

FIG. 1 represents the progression of the efficiency factor (f) for solutions 1 and 2 of the invention and for solution T of the prior art in relation to temperature (in ° C.).

This efficiency factor (f) was determined by measuring the relaxation times $T_1$ and $T_{10}$ of the radical solutions and the pure solvent respectively since $f=1-T_1/T_{10}$. In this FIG. 1, it will be noticed that the gain in efficiency factor is 55 to 70% according to temperature for solution 1. On the other hand, the gain achieved by solution 2 is only obtained at very high temperatures.

Figure 2:
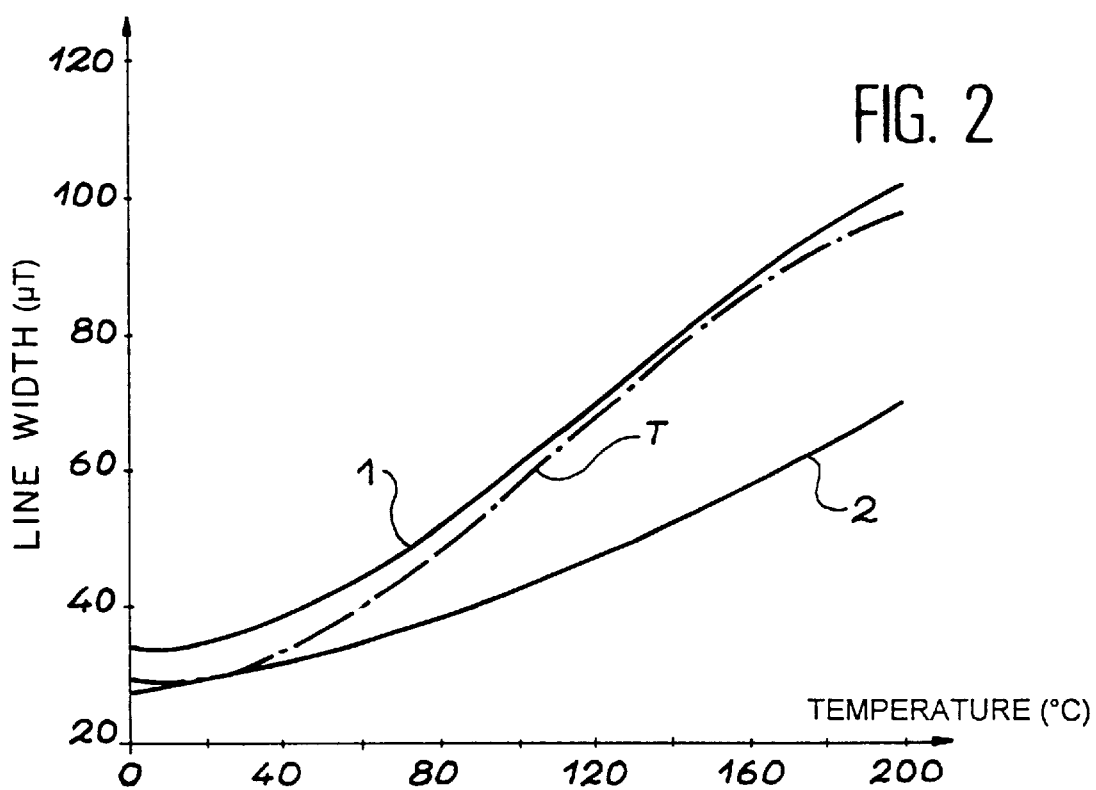
FIG. 2 is a diagram illustrating the progression of line width (in mTesla) in relation to temperature (in ° C.) for radical solutions (1) and (2) according to the invention and for solution T according to the prior art.

FIG. 2 shows the progression of line width RPE (in mTesla) of solutions 1 and 2 of the invention and of solution T of the prior art in relation to temperature (in ° C.). Line widths were determined using the method described in Journal de Physique, Tome 36, June 1975, pages 571 to 580.

In FIG. 2 it will be seen that the line widths RPE of solution 1 are comparable with those of solution T. On the other hand, the line widths of solution 2 are narrower.

Figure 3:
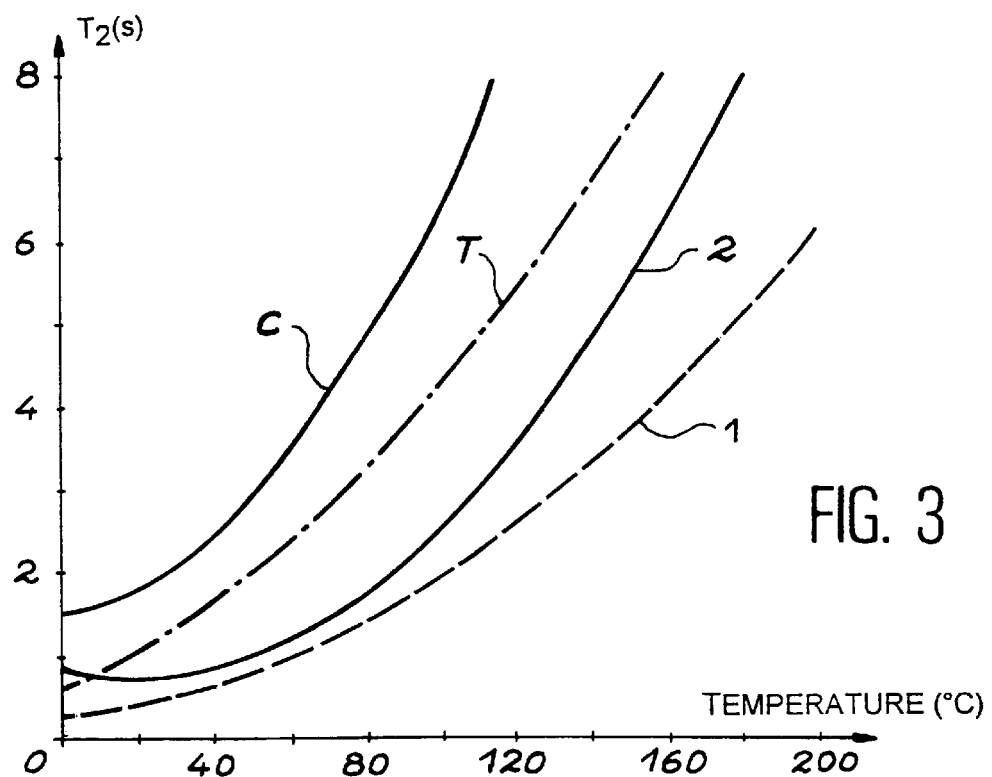
FIG. 3 is a diagram representing the progression of NMR relaxation time, $T_2$ (in s), in relation to temperature (in ° C.) for radical solutions 1 and 2 of the invention, radical solution T of the prior art and solution C given for comparative purposes.

FIG. 3 represents the progression of relaxation time $T_2$ (in s) in relation to temperature (in ° C.) for solutions 1 and 2 of the invention, solution T of the prior art and solution C given for comparison, comprising $10^{-3}$ mol/l of Tmio in a solvent that is identical to that of solution T (water +5% diglyme). These relaxation times were determined using the free precession method described in the thesis published by M. P. Ferroud Plattet, Université Joseph Fourier de Grenoble, 1992, pages 125–141. On examining this figure it will be noticed that shorter relaxation times are obtained with the solutions of the invention and that they consequently have better resistance to field gradients.

It will also be noticed that if the solvent of solution 2 of the invention is changed and replaced by water with 5% diglyme (solution C), much longer relaxation times $T_2$ are obtained. Therefore solution C is not at all suitable for drilling applications. If the solution is to be efficient in the face of strong magnetic field gradients (drilling conditions related to the presence of magnetic silt) the nuclear relaxation time $T_2$ must be as short as possible. If a comparison is made, using FIG. 3, between the variation in nuclear relaxation times $T_2$ of each solution (solutions 1 and 2 of the invention and solution C of Tmio with the solvent water +5% diglyme), it will be seen that the difference varies by more than a 2 to 3 factor at temperatures between 100° C. and 150° C. for solutions 2 and C, and that for solution 1 of the invention which is twice as concentrated the difference is even more favourable.

Figure 4:
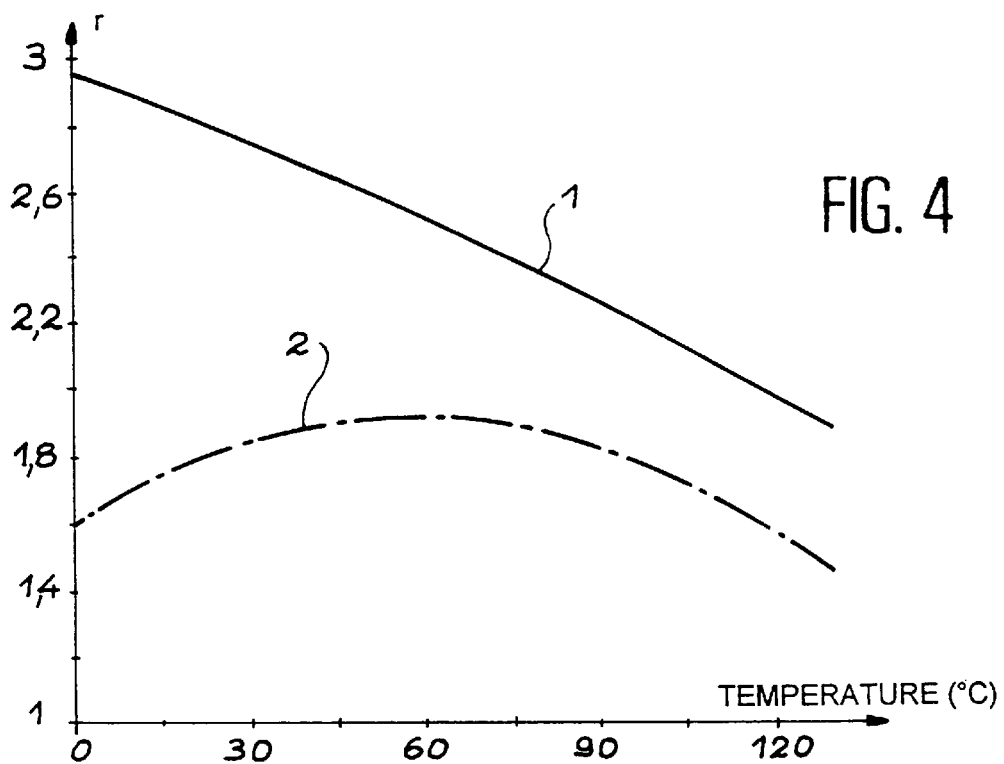
FIG. 4 is a diagram representing the amplification factor (ratio r: $T_2$ solution T/$T_2$ solution 1 or 2) in relation to temperature (in ° C.).

FIG. 4, which represents the ratio r between the relaxation time $T_2$ of solution T and the relaxation time $T_2$ of solution 1 or solution 2 in relation to temperature (in ° C.), confirms these results.

This expresses the amplifying factor of the field gradient applicable to the solution of the invention in relation to nitroxide radical concentration. The applicable gradient is two to three times higher than the previously acceptable gradients for solution T.

Figure 5:
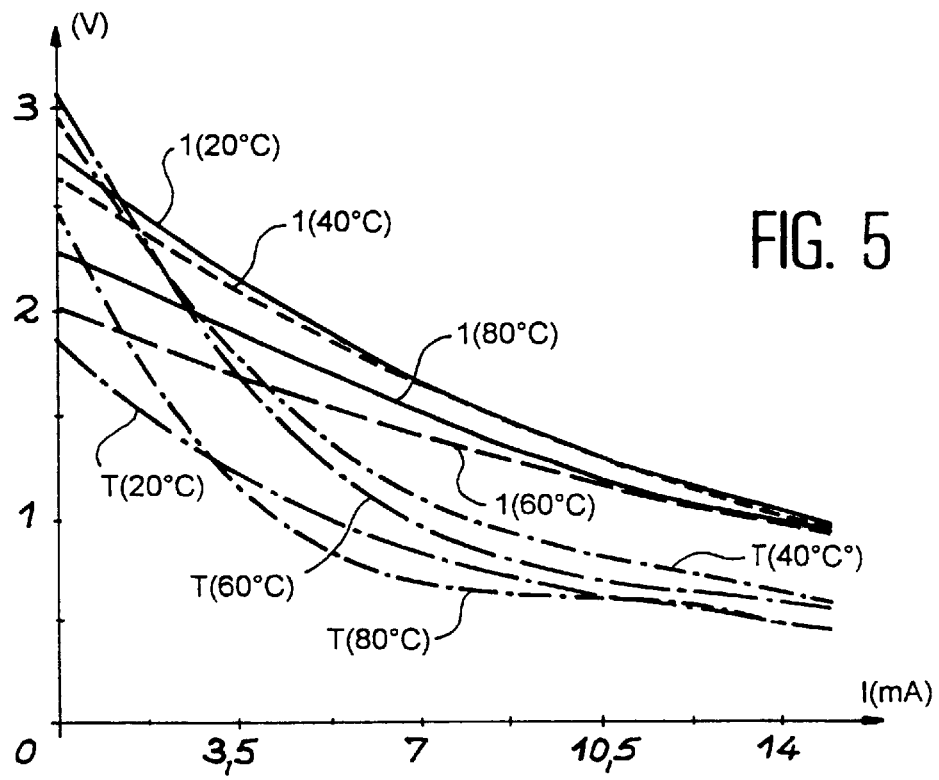
FIG. 5 is a diagram representing the NMR signal (in Volts) in relation to intensity (in mA) for solution 1 of the invention at temperatures of 20, 40, 60 and 80° C. and for solution T of the prior art at the same temperatures.

FIG. 5 represents the NMR signal (in Volts) exiting a laboratory probe for solution 1 of the invention and solution T of the prior art at temperatures of 20, 40, 60 and 80° C. in relation to the intensity (in mA) which expresses field gradient. Therefore, for 3.5 mA the field gradient is 350 nT/m in transverse direction and 40 nT/m in longitudinal direction. The graphs were obtained using a laboratory-designed low field NMR spectrometer.

For a field gradient of zero and a temperature of more than 20° C., the NMR signal of solution T of the prior art is higher than that of solution 1 of the invention.

On the other hand, at a temperature of 20° C. or less, at any magnetic field gradient value, solution 1 of the invention is better.

At 40° C. for a field gradient of more 15 nT/m in longitudinal direction of the probe (respectively 126 nT/m in transverse direction) the NMR signal of solution 1 becomes stronger than that of solution T of the prior art, and this phenomenon increases as temperature rises. With increasing temperatures the minimum gradient at which solution 1 is better considerably decreases; it is three times less at 80° C.

Therefore, with a low field gradient, the NMR signal of solution 1 of the invention is always higher than that of solution T over the entire range of temperatures examined, and this advantage increases with the value of the gradient applied as the NMR signal of solution T drops abruptly whereas that of solution 1 of the invention decreases gradually.

Figure 6:
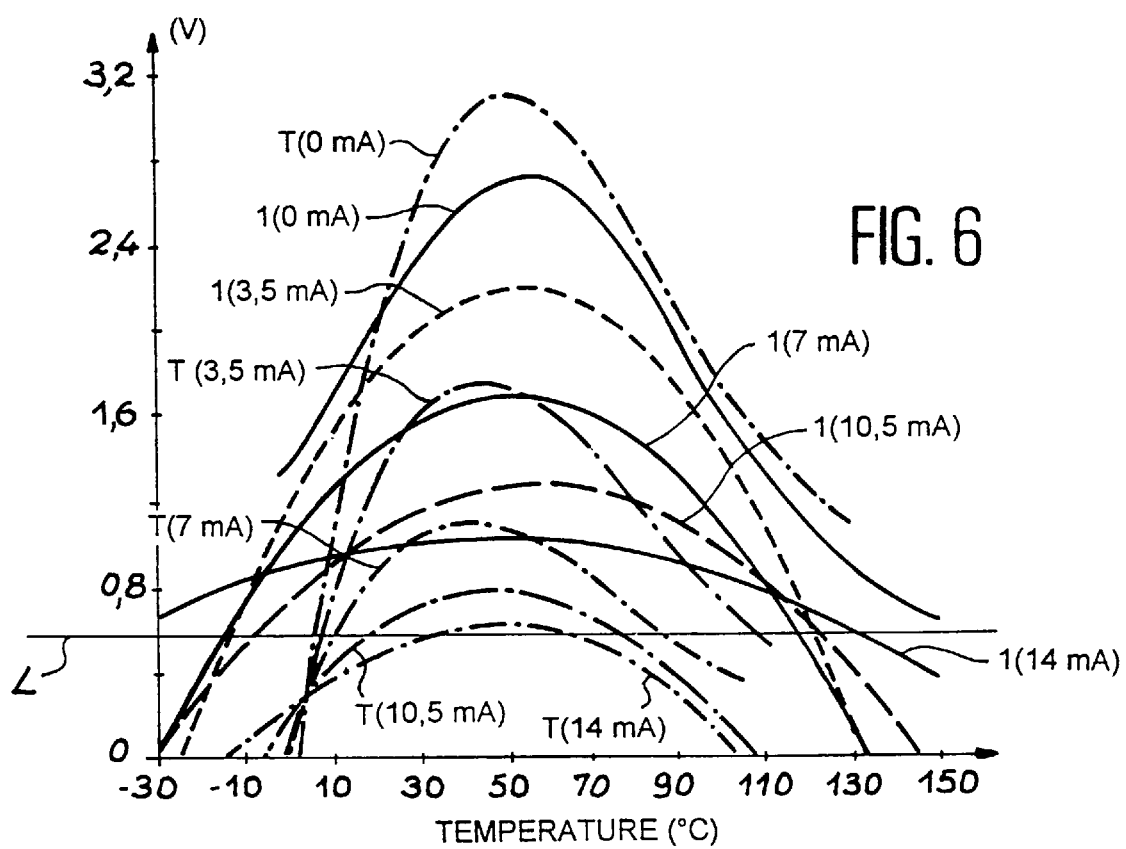
FIG. 6 is a diagram representing the NMR signal (in Volts) exiting the probe in relation to temperature (in ° C.) for intensities of 0 mA, 3.5 mA, 7 mA, 10.5 mA and 14 mA for radical solution 1 of the invention and radical solution T of the prior art.

FIG. 6 illustrates the NMR signal exiting the probe (in Volts) in relation to temperature (in ° C.) for various field gradients; this figure illustrates the range of temperatures over which a magnetometer of the invention using the solution of the invention can operate.

The operating range of the captor is determined using the temperature range for which the NMR signal recorded on the laboratory spectrometer (high temperature probe) is higher than the limit L of 0.6 Volt. This figure shows the very sudden drop of the NMR signal of solution T due to the field gradient, a drop to be compared with the signal of solution 1 which decreases more slowly. In a strong magnetic field gradient environment, the operating range of the captor containing solution 1 is therefore −30 to +130° C. whereas the captor using solution T no longer operates; this range is 0° C. to 150° C. in a magnetically free medium for solution 1.

Knowing the maximum gradients tolerated by the captor using solution T, that is 700 nT/m, 500 nT/m and 200 nT/m approximately at the respective temperatures of 40, 70 and 100° C., it can be predicted that the values of the equivalent gradients for solution 1 are approximately 1900 nT/m, 1200 nT/m and 450 nT/m respectively at the same temperatures.

Figure 7:
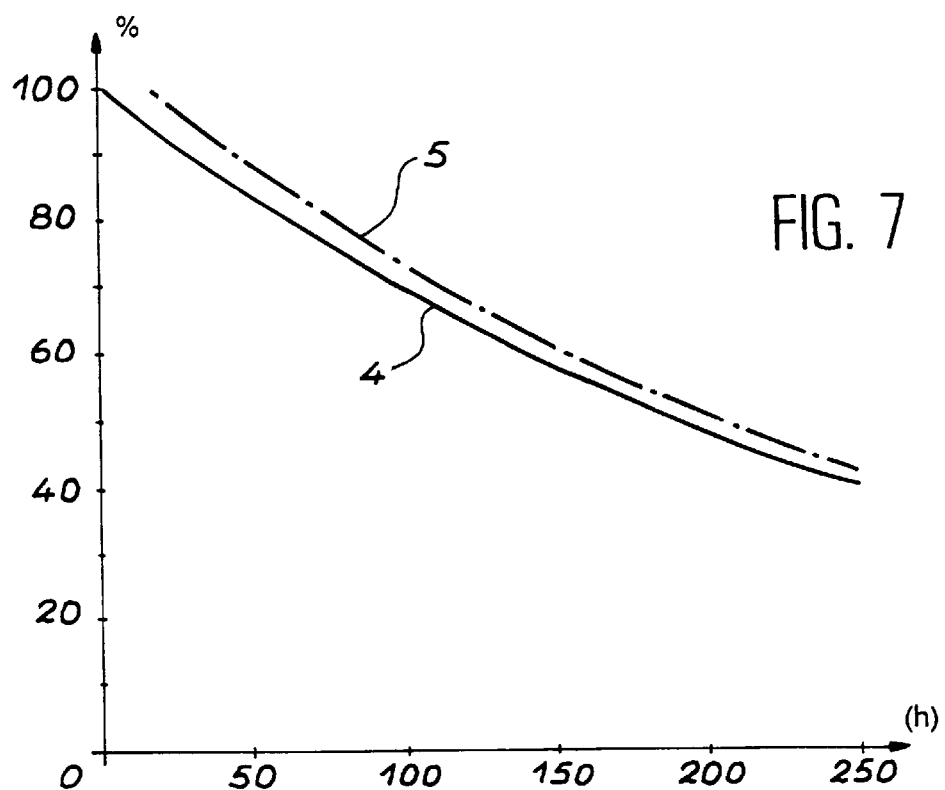
FIG. 7 is a diagram representing the half-life period of radical solution 1 of the invention in relation to temperature (in ° C.).

FIG. 7 represents the degradation kinetics of solution 1 of the invention at 150° C. This figure illustrates the percentage of the RPE signal obtained after heating in relation to the period of heating at 150° C. (in hours).

In this figure curve 4 illustrates the percentage of the RPE signal after heating, and curve 5 illustrates the percentage of RPE signal after heating and period of rest.

In this figure it will be noticed that the half-life period (50% of the RPE signal) is 180 hours.

Figure 8:
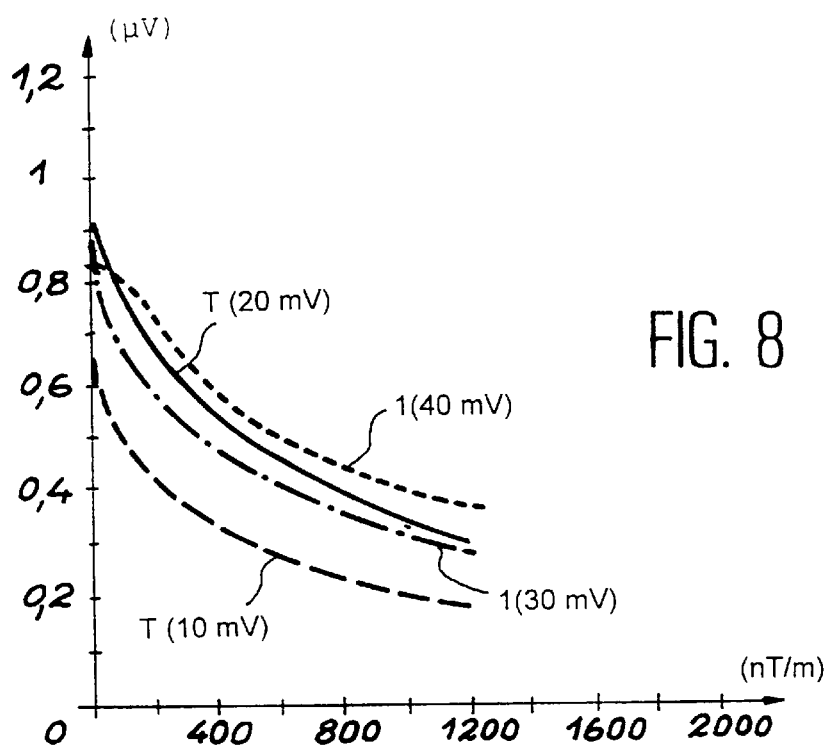
FIGS. 8 to 10 are diagrams representing the nuclear signal (in mV) of nuclear magnetic resonance captors with dynamic polarization using, either solution 1 of the invention, or solution T of the prior art, in relation to the outer magnetic field gradient applied to the axis of the captor (en nT/m), at a temperature of 20° C.
Figure 9:
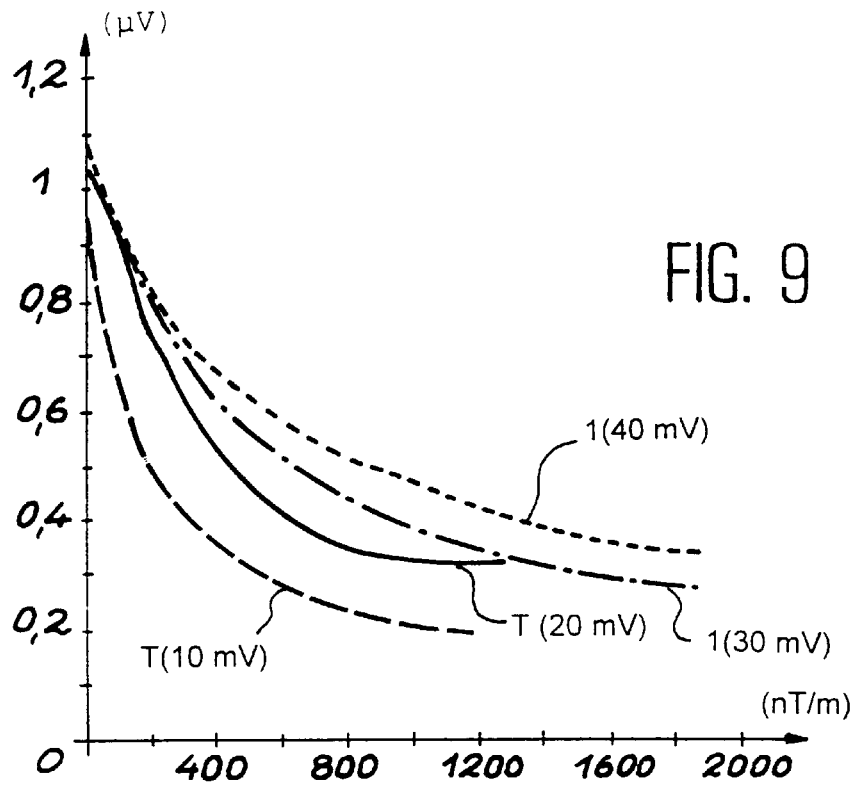
Figure 10:
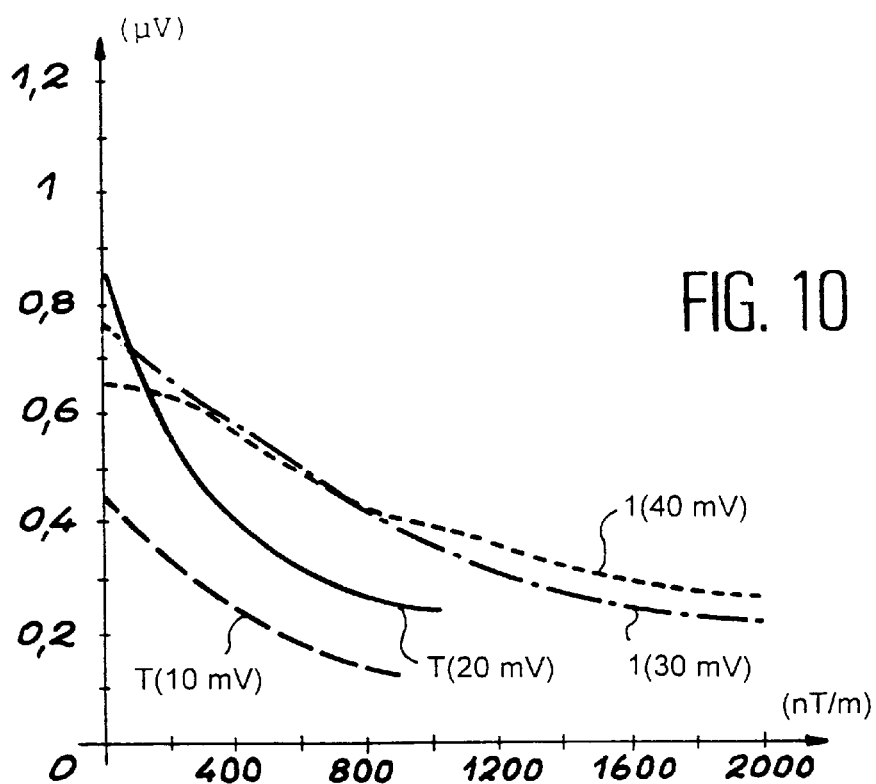

FIGS. 8 to 10 represent the progression of the nuclear signal (in μV) exiting the dynamic polarization nuclear magnetic resonance captors using the solution of the invention or solution T of the prior art, in relation to the magnetic field gradient (en nT/m) applied to the axis of the captor at 20° C. (FIG. 8), at 50° C. (FIG. 9) and at 100° C. (FIG. 11).

In each figure the curves are referenced 1 for solution 1 of the invention and T for solution T of the prior art; injection tension values are also given (in mV).

Examination of these curves reveals that with no gradient and at temperatures of more than 100° C., the nuclear signal exiting the captor with the solution of the invention is stronger than that of the captors using solution T of the prior art operating with an injection tension of 10 mV. The gain is 88%, 73% and 100% in a magnetic field gradient of 200 nT/m at respective temperatures of 20° C., 50° C. and 100° C.

Also, the same signal level is reached for solution 1 of the invention with a gradient that is three times higher at 20° C., between four and five times higher at 50° C. and seven times higher at 100° C. than for solution T (Tanane+water+5% diglyme, M/1000).

FIGS. 11 to 14 represent the progression of the signal to noise ratio S/B (in dB/√Hz) in relation to the outer magnetic field gradient (in nT/m) applied to the axis of the captor for nuclear oscillators comprising the captor made with solution 1 of the invention or solution T of the prior art and associated electronics which allow the unit to operate at industrial level.

The excitation conditions of the nuclear and magnetic resonances were:

injection tension $V_{inj}$=40 mV energy HF $P_{hf}$=0.6 W in FIGS. 11 and 12 which relate to solution 1 of the invention at a temperature of 40° C. (FIG. 11) and at 70° C. (FIG. 12).

FIG. 13 (temperature of 40° C.) and FIG. 14 (temperature of 70° C.) relate to solution T for which excitation conditions were:

$V_{inj}$=40 mV and $P_{hf}$=0.6 W.

A study of the curves in FIGS. 11 to 14 shows that the oscillator using solution 1 of the invention performs better in relation to temperature and the presence of magnetic field gradients than the magnetometer made with the solution of the prior art.

Whereas the captor with solution T only operates in the presence of gradients of less than 500 nT/m at 40° C. and 400 nT/M at 70° C., the captor using the solution of the invention operates over the same temperature range in the presence of gradients reaching values of 1500 nT/m.

FIG. 15 represents NMR signal variation (in V) in relation to temperature (in ° C.) for solution 1 of the invention and for solution C given for comparative purposes.

In this figure it can be seen that the NMR signal of solution C is substantially weaker than that of solution 1 of the invention whereas the line width RPE of this solution (0.57 G at 150° C.) is relatively low and already very favorable for dynamic polarization. If a solution of Tmio M/500 in water +5% diglyme was used, the NMR signal would not be better. Since electronic relaxation increases with radical concentration, the solution would have greater line widths RPE and a much lesser dynamic polarizing factor and therefore a lesser NMR signal. Also, the nuclear relaxation time $T_2$ would still remain higher than that of the solution of the invention.

Therefore the use according to the invention of a solvent consisting of triglyme or tetraglyme will allow the application of Tmio solutions in oil drilling magnetometry.

FIG. 16 represents a section drawing of a nuclear magnetic resonance magnetometer probe in which the solution of the invention can be used. The probe consists of two similar units 3 and 5 aligned along the ZZ' axis; unit 3 comprises a coil 7 forming a low frequency circuit creating the excitation field of protonic resonance and also serving to detect the nuclear signal, which surrounds a first sample 8. Unit 5 comprises a coil 7' forming a high frequency circuit creating the excitation field of electronic resonance consisted of a coaxial resonator connected to the frequency giving maximum dynamic amplification. Coil 7' surrounds sample 8'. Samples 8 and 8' consist of the radical solution of the invention and they are contained in two independent containers 10 and 10' which are symmetrical, spherical jars whose walls are coated with silvered paint according to sectors separated from each other by breaks. The excitation resonating cavity comprises two silvered cylinders 12 and 12' connected to the initial conductor of a coaxial cable 13.

In this probe, the nuclear signal appears at Larmor frequency:

$$Fo = \frac{\gamma_1 B_o}{2\pi}$$

Yr being the gyromagnetic ratio of the proton and $B_o$ being the earth's magnetic field.

Adapted electronics at the probe exit measure signal frequency and therefore indicate the value of the earth field.

This probe is currently used in drilling wells operated by Schlumberger. Other geometries exist using the same principles.

This probe is of considerable interest as it allows the measurement of magnetic fields at temperatures as high as 180° without the probe being destroyed.

We claim:

1. Solution containing a nitroxide radical for nuclear magnetic resonance magnetometry, characterized in that it consists of a nitroxide radical with the formula:

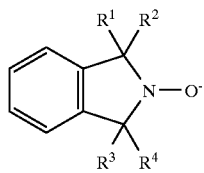

(I)

in which $R^1$, $R^2$, $R^3$ and $R^4$ which may be identical or different represent an alkyl group or an alkoxy group which may be deuterated, or in which the $R^1$–$R^2$ and/or $R^3$–$R^4$ couples together form a cycloalkyl or polycycloalkyl group which may be deuterated, and N represents $^{14}$N or $^{15}$N, dissolved in a solvent consisting of a dimethyl ether with the formula:

$CH_3O(CH_2CH_2O)n\ CH_3$ (II)

in which n equals 3 or 4.

2. Solution according to claim 1 characterized in that $R^1$, $R^2$, $R^3$ and $R^4$ represent the methyl group which may be deuterated.

3. Solution according to claim 1, characterized in that N represents $^{15}$N.

4. Solution according to claim 2, characterized in that N represents $^{15}$N.

5. Solution according to claim 1, characterized in that the solvent is the dimethyl ether in which n is 3.

6. Solution according to claim 1, characterized in that the solvent is the dimethyl ether in which n is 4.

7. Solution according to claim 1, characterized in that it comprises $10^{-3}$ to $10^{-2}$ mol/l of nitroxide radical.

8. Solution according to claim 1, characterized in that it consists of 1,1,3,3-tetramethylisoindoline-2-yloxyl dissolved at a concentration of $2.10^{-3}$ mol/l in the dimethyl ether where n equals 3.

9. Nuclear magnetic resonance magnetometer probe comprising two units each comprising a coil surrounding a container filled with a sample consisting of a solution containing a nitroxide radical, and two resonating cavities to excite the two samples at two separate frequencies, characterized in that each sample is a solution of a nitroxide radical according to claim 1.

10. Probe according to claim 9, characterized in that the solution consists of 1,1,3,3-tetramethylisoindoline-2-yloxyl dissolved at a concentration of $2.10^{-3}$ mol/l in the dimethyl ether in which n equals 3.

11. Solution according to claim 1, characterized in that a number of carbon atoms in the alkyl group or the alkoxy group ranges from 1 to 5.

12. Solution according to claim 1, characterized in that the alkyl group or the alkoxy group is linear.

13. Solution according to claim 1, characterized in that at least one of $R^1$, $R^2$, $R^3$ and $R^4$ is a methyl group.

14. Solution according to claim 1, characterized in that at least one hydrogen atom in at least one group selected from $R^1$, $R^2$, $R^3$, $R^4$, $R^1$–$R^2$ and $R^3$–$R^4$ is replaced with deuterium.

15. Solution according to claim 1, characterized in that a concentration of the nitroxide radical in the solvent ranges from $10^{-3}$ to $10^{-2}$ mol/l.

* * * * *